(12) United States Patent
Urmson et al.

(10) Patent No.: US 9,048,370 B1
(45) Date of Patent: Jun. 2, 2015

(54) DYNAMIC CONTROL OF DIODE BIAS VOLTAGE (PHOTON-CAUSED AVALANCHE)

(71) Applicant: Google Inc., Mountain View, CA (US)

(72) Inventors: Chris Urmson, Mountain View, CA (US); Pierre-yves Droz, Mountain View, CA (US); Luke Wachter, Mountain View, CA (US)

(73) Assignee: Google Inc., Mountain View, CA (US)

( * ) Notice: Subject to any disclaimer, the term of this patent is extended or adjusted under 35 U.S.C. 154(b) by 64 days.

(21) Appl. No.: 13/804,455

(22) Filed: Mar. 14, 2013

(51) Int. Cl.
*G01J 1/44* (2006.01)
*H01L 31/107* (2006.01)

(52) U.S. Cl.
CPC ................... *H01L 31/107* (2013.01)

(58) Field of Classification Search
CPC ..................... G01J 1/18; G01J 1/44
USPC ......................................... 356/5.01
See application file for complete search history.

(56) References Cited

U.S. PATENT DOCUMENTS

| | | | |
|---|---|---|---|
| 3,790,277 A | 2/1974 | Hogan | |
| 4,464,048 A * | 8/1984 | Farlow | ......................... 356/5.08 |
| 4,700,301 A | 10/1987 | Dyke | |
| 4,709,195 A | 11/1987 | Hellekson et al. | |
| 5,202,742 A | 4/1993 | Frank et al. | |
| 5,929,982 A * | 7/1999 | Anderson | .................... 356/73.1 |
| 6,522,396 B1 | 2/2003 | Halmos | |
| 7,089,114 B1 | 8/2006 | Huang | |
| 7,248,342 B1 | 7/2007 | Degnan | |
| 7,255,275 B2 | 8/2007 | Gurevich et al. | |
| 7,560,683 B2 * | 7/2009 | Takahashi et al. | ........ 250/214 R |
| 7,969,558 B2 | 6/2011 | Hall | |
| 8,017,900 B2 | 9/2011 | Mathewson et al. | |
| 8,279,411 B2 | 10/2012 | Yuan et al. | |
| 2011/0133059 A1 | 6/2011 | Kim et al. | |

\* cited by examiner

*Primary Examiner* — Luke Ratcliffe
*Assistant Examiner* — Vicente Rodriguez
(74) *Attorney, Agent, or Firm* — McDonnell Boehnen Hulbert & Berghoff LLP

(57) ABSTRACT

Methods and devices are provided for determining an operating bias voltage of a photodiode. One example method includes (i) varying a bias voltage of a photodiode; (ii) detecting spurious signals generated by the photodiode while varying the bias voltage of the photodiode; (iii) determining a threshold bias voltage at which a frequency of occurrence of the spurious signals reaches a threshold frequency; (iv) determining an operating bias voltage for the photodiode based on at least the threshold bias voltage; and (v) operating the photodiode with the operating bias voltage in a light-detection and ranging (LIDAR) system.

20 Claims, 7 Drawing Sheets

DYNAMIC CONTROL OF DIODE BIAS VOLTAGE (PHOTON-CAUSED AVALANCHE)

BACKGROUND

Unless otherwise indicated herein, the materials described in this section are not prior art to the claims in this application and are not admitted to be prior art by inclusion in this section.

Light-detection and ranging (LIDAR) is an optical remote sensing technology that may be utilized to acquire information on a surrounding environment. The acquired information may include the distances between objects or properties of objects in the surrounding environment. A LIDAR device may be configured to illuminate the objects with light, detect light reflected from the objects, and determine information about the objects based on the reflected light. The LIDAR device may use ultraviolet, visible, or infrared light to illuminate and acquire information on a variety of different types of objects, such as metallic and non-metallic items, geological formations, and even atmospheric elements.

When a LIDAR device attempts to sense the presence of an object that is far away, a light beam, which is often a laser beam, may travel a relatively long distance (both from the LIDAR device to the object and from the object back to the LIDAR device). Because of the relatively long distance of travel, the beam is often significantly attenuated by the time it returns to the LIDAR device. In other words, a relatively small number of photons reflected by far-away objects return to the LIDAR device. This makes it relatively difficult to sense the presence of such far-away objects.

The relatively small number of photons can be detected by operating a photodetector at a high gain. For example, the photodector can be a photodiode operated at a high enough bias voltage such that a P-N junction of the photodiode becomes large enough to achieve an "avalance" effect, in which a single photon received by the photodiode can result in the excitation of many electrons. A photodiode operated under these conditions is sometimes referred to as an "avalance photodiode" or a "single photon avalanche detector."

To achieve the avalanche effect, the photodiode may be operated at a bias voltage that is just below the breakdown voltage of the photodiode. For example, a photodiode's breakdown voltage can be determined and the photodiode can then be operated with a bias voltage that is somewhat less than the determined breakdown voltage.

SUMMARY

Disclosed herein are methods and systems for determining an operating bias voltage of a photodiode. The bias voltage of the photodiode can be varied (e.g., increased as a function of time) and spurious signals generated by the photodiode can be detected while the bias voltage is varied. A frequency of occurrence of the spurious signals may reach a threshold frequency when the bias voltage reaches a threshold bias voltage. The operating bias voltage of the photodiode may then be determined based on at least the threshold bias voltage.

In one aspect, a method is provided. The method may involve: (a) varying a bias voltage of a photodiode; (b) detecting spurious signals generated by the photodiode while varying the bias voltage of the photodiode; (c) determining a threshold bias voltage at which a frequency of occurrence of the spurious signals reaches a threshold frequency; (d) determining an operating bias voltage for the photodiode based on at least the threshold bias voltage; and (e) operating the photodiode with the operating bias voltage in a light-detection and ranging (LIDAR) system.

In another aspect, a method is provided. The method may involve: (a) operating a photodiode in an online mode in which the photodiode receives one or more light pulses transmitted by a light-detection and ranging (LIDAR) system; (b) after operating the photodiode in the online mode, operating the photodiode in an offline mode in which the photodiode does not receive light pulses transmitted by the LIDAR system, where operating the photodiode in the offline mode includes: (i) varying a bias voltage of the photodiode; (ii) detecting spurious signals generated by the photodiode while varying the bias voltage of the photodiode; (iii) determining a threshold bias voltage at which a frequency of occurrence of the spurious signals reaches a threshold frequency; and (iv) determining an operating bias voltage for the photodiode based on at least the threshold bias voltage; and (c) after operating the photodiode in the offline mode, operating the photodiode in a subsequent online mode in which the photodiode receives one or more light pulses transmitted by the LIDAR system, where operating the photodiode in the subsequent online mode includes operating the photodiode with the operating bias voltage.

In a further aspect, a LIDAR device is provided. The device may include: (a) a light source, where the light source is configured to emit light pulses; (b) a photodiode, where the photodiode is configured to receive light pulses that have been transmitted by the light source and reflected by one or more objects in an environment of the LIDAR device; (c) a voltage source configured to apply a bias voltage to the photodiode; and (d) a controller configured to: (i) control the power source to vary the bias voltage applied to the photodiode; (ii) detect spurious signals generated by the photodiode while varying the bias voltage; (iii) determine a threshold bias voltage at which a frequency of occurrence of the spurious signals reaches a threshold frequency; (iv) determine an operating bias voltage based on at least the threshold bias voltage; and (v) control the voltage source to apply the operating bias voltage to the photodiode.

In another aspect, example implementations may provide a device that includes: (a) means for varying a bias voltage of a photodiode; (b) means for detecting spurious signals generated by the photodiode while varying the bias voltage of the photodiode; (c) means for determining a threshold bias voltage at which a frequency of occurrence of the spurious signals reaches a threshold frequency; (d) means for determining an operating bias voltage for the photodiode based on at least the threshold bias voltage; and (e) means for operating the photodiode with the operating bias voltage in a LIDAR system.

These as well as other aspects, advantages, and alternatives, will become apparent to those of ordinary skill in the art by reading the following detailed description, with reference where appropriate to the accompanying drawings.

DETAILED DESCRIPTION

Figure 1:
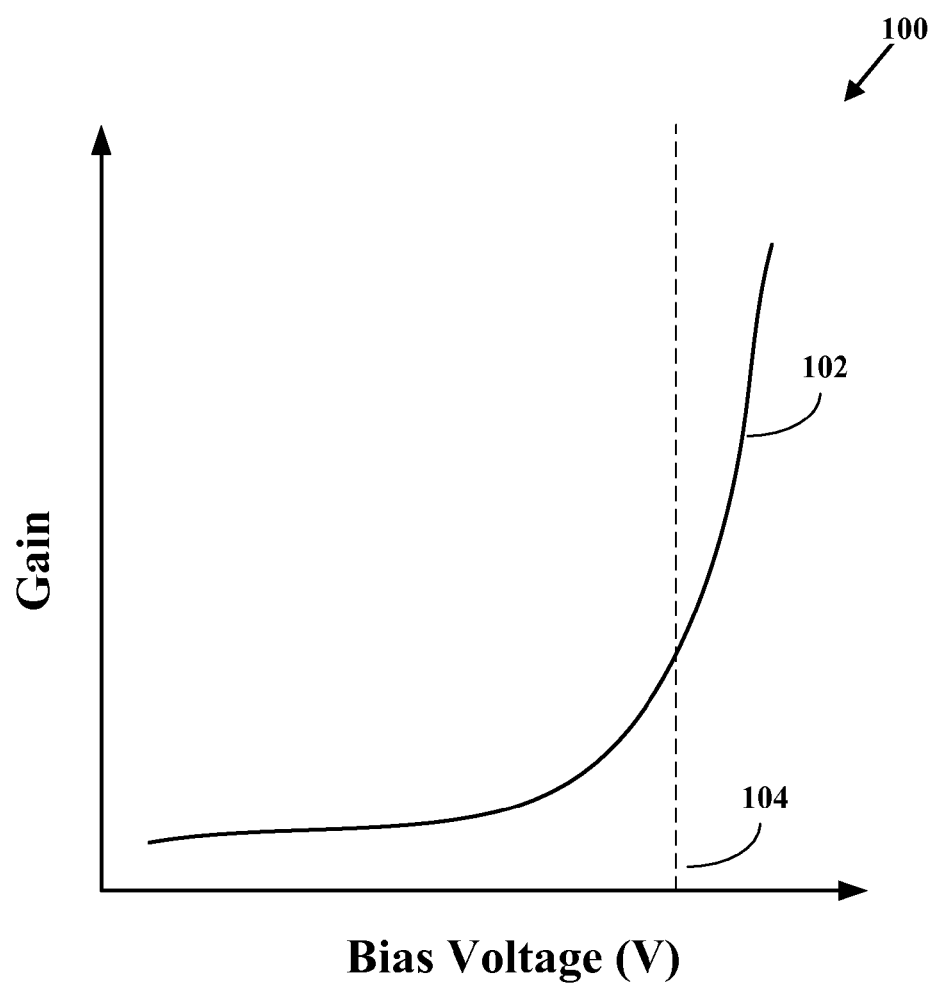
FIG. 1 shows the gain of an avalanche photodiode as a function of bias voltage, in accordance with an example embodiment.

In the following detailed description, reference is made to the accompanying figures, which form a part thereof. In the figures, similar symbols typically identify similar components, unless context dictates otherwise. The illustrative embodiments described in the detailed description, figures, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the figures, can be arranged, substituted, combined, separated, and designed in a wide variety of different configurations, all of which are contemplated herein.

A light-detection and ranging (LIDAR) device may be configured to illuminate an object in a surrounding environment with a light pulse. In some instances, the LIDAR device may also detect a corresponding light pulse reflected from the object and determine information about the object based on the detection of the reflected light. The detection of the reflected light pulse may be implemented in different ways. In one example, the LIDAR device may be configured to measure a signal generated from the reflected light pulse. For instance, the signal may be sampled using a photodiode.

A photodiode is an electronic semiconductor device used to sense light. In many applications, the photodiode may be used to convert light into to an electrical current. Thus, by measuring the electrical current, the amount of light sensed by the photodiode may be derived.

In particular, incoming photons (i.e., particles of light) enter the photodiode and create charged carriers (i.e., electrical current). Through the application of a bias voltage on the photodiode, the light drives the voltage beyond a breakdown voltage to set charged carriers free, creating a measurable amount of electrical current.

However, photodiodes may need to have high levels of sensitivity in some applications. For example, consider sending a light pulse to an object that is 100 meters away and receiving 50-100 photons upon the pulse's return. In such instances, it is desirable to accurately determine the number of photons returned. However, a standard photodiode may provide unpredictable results when attempting to measure single photons under certain conditions (e.g., inadequate lighting conditions or noisy environments). As such, photodiodes may not provide optimal sensitivity in those circumstances.

An avalanche photodiode (APD) is a special kind of a photodiode. The APD is also used to sense light, but with a higher level of sensitivity. As such, it can detect even individual photons. Through what is referred to as the "avalanche breakdown," the charged carriers are accelerated in an electric field to produce additional carriers. In particular, a single photon that enters the APD may generate hundreds or even thousands of carriers. Thus, a single photon can be sufficient to generate a constant current measurable by other electronic devices.

The bias voltage in the APD is much higher than in conventional photodiodes. By applying a high reverse bias voltage (typically 100-200 V in silicon), the APD is designed to experience the avalanche breakdown at specified voltages. The APD allows each photon-generated carrier to be multiplied by avalanche breakdown, resulting in internal gain within the photodiode.

FIG. 1 shows the gain of an avalanche photodiode as a function of bias voltage, in accordance with an example embodiment. As depicted in the figure, as the operating bias voltage of the APD increases, the APD generates an increasing internal gain 102. As the bias voltage nears the breakdown voltage 104 of the APD, the gain 102 increases rapidly. The sensitivity of the photodiode also increases rapidly.

Notably, as depicted in FIG. 1, when the bias voltage of the APD approaches the breakdown voltage 104, the gain 102 of the APD varies strongly with the bias voltage. As such, even a small change in the bias voltage can result in a large change in the internal gain (and the sensitivity) of the APD.

At higher sensitivity levels, the APD is able to detect objects that are further away. Additionally, the APD can detect objects in low-light conditions. However, the APD is also more likely to generate spurious signals, which add noise. Therefore, it is desirable to control the sensitivity of the APD in order to achieve a particular signal-to-noise ratio (SNR). The sensitivity of the APD can be controlled by controlling the bias voltage that is applied to the APD.

Figure 2:
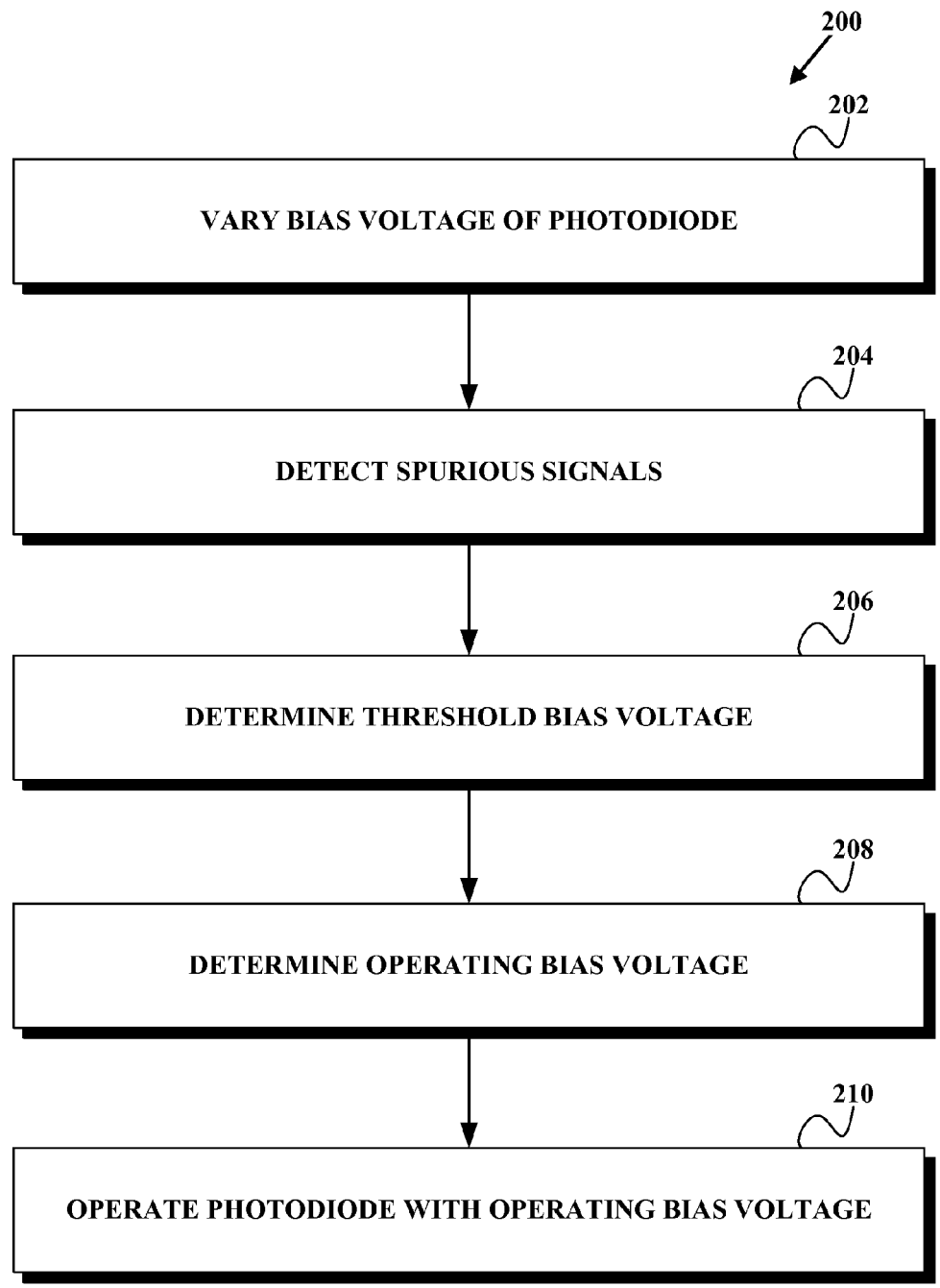
FIG. 2 is a flowchart depicting a method for determining the operating bias voltage of a photodiode, in accordance with an example embodiment.

An example method may involve varying a bias voltage of a photodiode and detecting spurious signals to determine an operating bias voltage for the photodiode. FIG. 2 is a flowchart depicting such an example method 200 for determining the operating bias voltage of a photodiode, in accordance with an example embodiment. Method 200 shown in FIG. 2 presents an embodiment of a method that could be implemented in a LIDAR device, and may be performed by a computing device or processor of the LIDAR device.

Method 200 may include one or more operations, functions, or actions as illustrated by one or more of blocks 202-210. Although the blocks are illustrated in a sequential order, these blocks may also be performed in parallel, and/or in a different order than those described herein. Also, the various blocks may be combined into fewer blocks, divided into additional blocks, and/or removed based upon the desired implementation. In addition, for the method 200 and other processes and methods disclosed herein, the flowchart shows functionality and operation of one possible implementation of present embodiments. In this regard, each block may represent a module, a segment, or a portion of program code, which includes one or more instructions executable by a processor or electronic circuit for implementing specific logical functions or steps in the process.

The program code may be stored on a storage medium, or any type of computer readable medium such as, for example, a storage device including a disk or hard drive. The computer readable medium may include non-transitory computer readable medium, for example, such as computer-readable media that stores data for short periods of time like register memory, processor cache, and Random Access Memory (RAM). The computer readable medium may also include non-transitory media, such as secondary or persistent long term storage, like read only memory (ROM), optical or magnetic disks, compact-disc read only memory (CD-ROM), for example. The computer readable media may also be any other volatile or non-volatile storage systems. The computer readable medium may be considered a computer readable storage medium, for example, or a tangible storage device.

Figure 3A:
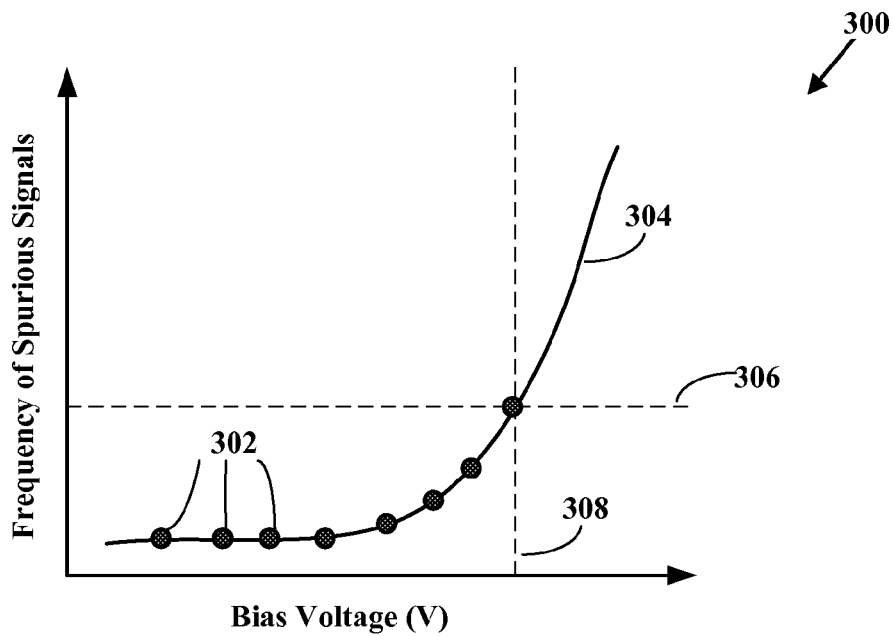
FIG. 3A shows the determination of a threshold bias voltage for a photodiode based on how the frequency of spurious signals varies as a function of bias voltage, in accordance with an example embodiment.

At block 202, the method 200 may involve applying a bias voltage to a photodiode and varying the bias voltage. Varying the bias voltage can involve applying a number of separate distinct bias voltages 302, as shown in FIG. 3A. In one embodiment, these voltages are applied in increasing order. However, the applied bias voltages may also sometimes be decreased. In another embodiment, the applied bias voltages are increased substantially linearly. In an additional embodiment, the applied bias voltages are selected from within the range of 150 volts to 220 volts. However, other voltage ranges may also be used.

At block 204, the method 200 may involve detecting spurious signals. For example, a spurious signal may be detected by determining when the photodiode generates a measurable current without receiving a return light signal from a target object. A spurious signal may include one or more measurable parameters generated by the photodiode, including a current parameter (e.g., dark current or surface leakage current) or a voltage parameter (e.g., a current converted into a voltage).

At each of one or more voltage levels, a frequency of spurious signals generated by the photodiode may be determined. The frequency of spurious signals may be the number of spurious signals occurring in a particular amount of time. For example, the frequency may be the number of spurious signals occurring per 100 milliseconds (ms). As can be seen in FIG. 3A, the frequency of spurious signals 304 typically increases as the applied bias voltage increases.

The frequency of spurious signals may be compared to a predetermined threshold frequency 306. The threshold frequency may be an acceptable level of spurious signals determined for a given application. For example, it may be decided that that a frequency of spurious signals of one spurious signal per 100 ms is an appropriate threshold frequency. If spurious signals occur more often than once per 100 ms, the noise level is too high. But if the spurious signals occur less frequently than once per 100 ms, the amount of noise is acceptable. In another example, the threshold frequency may be different depending on the bias voltage of the photodiode.

In an alternative embodiment, the frequency of spurious signals may be measured with respect to a frequency of return light signals from target objects. For example, other parameters of the photodiode may be measured, including signal-to-noise ratio (SNR), noise-equivalent power (NEP), responsivity, and detectivity. The threshold frequency may be set so that one or more of these parameters reach a particular level.

At block 206, the method 200 may involve determining a threshold bias voltage for the photodiode. FIG. 3A depicts an example of the determination of a threshold voltage 308. If the frequency of spurious signals 304 is lower than the threshold frequency 306, the applied bias voltage may be increased. The threshold voltage 308 may be determined by finding a bias voltage that causes a frequency of spurious signals 304 equal to or close to the threshold frequency 306.

Figure 3B:
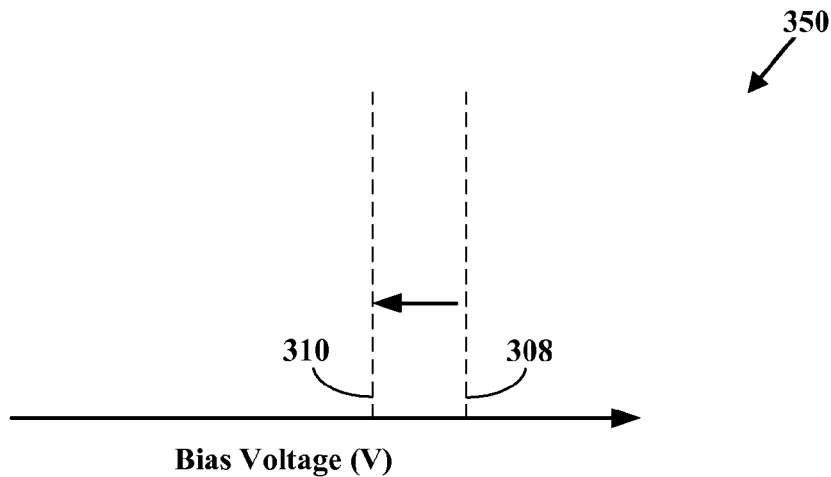
FIG. 3B shows the determination of an operating bias voltage for a photodiode based on the threshold bias voltage determined as shown in FIG. 3A, in accordance with an example embodiment.

At block 208, the method 200 may involve determining an operating bias voltage for the photodiode. FIG. 3B depicts an example of the determination of an operating bias voltage 310 for a photodiode, in accordance with an example embodiment. Once the threshold voltage 308 is determined, the operating bias voltage 310 for the photodiode may be set to a voltage less than the threshold voltage 308. In an example embodiment, the operating bias voltage 310 may be determined by subtracting a predetermined fixed amount from the threshold voltage 308. For example, the operating bias voltage may be set to the threshold voltage minus 2V, or the threshold voltage minus 3V.

At block 210, the method 200 may involve operating the photodiode with the operating bias voltage in a LIDAR system. After an operating bias voltage for the photodiode is determined at block 208, the operating bias voltage of the photodiode may be set to the determined voltage. The photodiode may then receive reflected light signals transmitted by the LIDAR system.

In an example embodiment, the steps 202-206 of method 200 may be repeated one or more additional times in order to determine one or more additional threshold bias voltages. Further, the steps 202-206 of method 200 can be carried out many times in a short period of time. Therefore, the procedure may be repeated as many as hundreds or thousands of times in order to attain a more precise operating bias voltage. Then, the multiple threshold bias voltages may be used together to statistically determine an operating bias voltage for the photodiode.

Figure 4A:
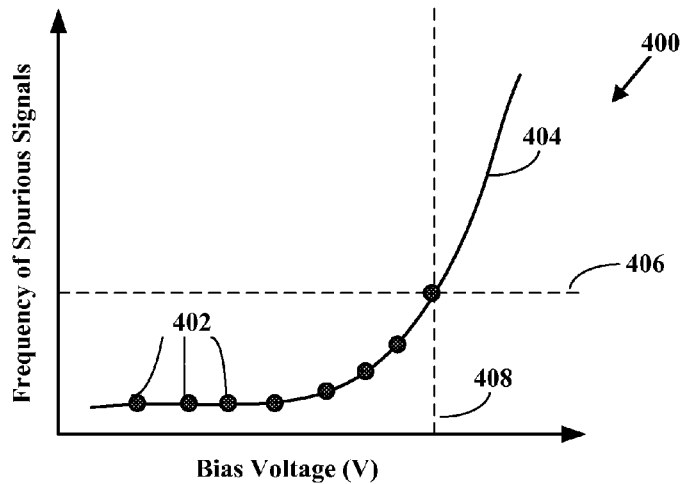
FIG. 4A shows a first instance of a threshold bias voltage being determined for a photodiode, in accordance with an example embodiment.

For example, the average of the threshold bias voltages may be computed, and then used to determine an operating bias voltage for the photodiode. FIG. 4A shows a first instance of the determination of a threshold bias voltage 408, in accordance with an example embodiment. Multiple bias voltages 402 may be applied to a photodiode. At each bias voltage, a frequency of spurious signals 404 may be detected. The frequency of spurious signals 404 may be compared to a threshold frequency 406. A first threshold voltage 408 may then be determined by finding a bias voltage that causes a frequency of spurious signals 404 at or near the threshold frequency 406.

Figure 4B:
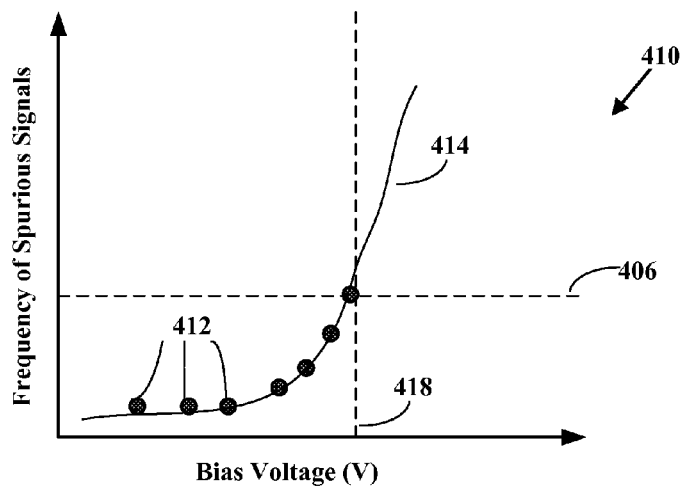
FIG. 4B shows a second instance of a threshold bias voltage being determined for a photodiode, in accordance with an example embodiment.

FIG. 4B shows a second instance of the determination of a threshold bias voltage, in accordance with an example embodiment. Multiple bias voltages 412 may again be applied to a photodiode. At each bias voltage, a frequency of spurious signals 414 may be detected. The frequency of spurious signals 414 may be compared to a threshold frequency 406. A second threshold voltage 418 may then be determined by finding a bias voltage that causes a frequency of spurious signals 414 at or near the threshold frequency 406.

Figure 4C:
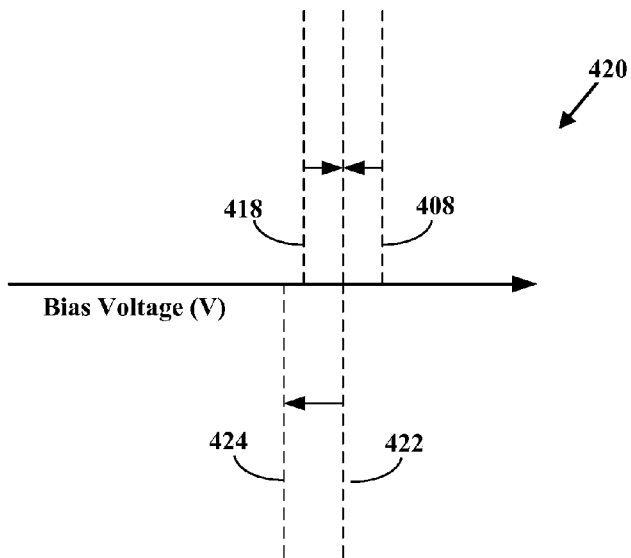
FIG. 4C shows the determination of an operating bias voltage for the photodiode based on multiple threshold bias voltages, in accordance with an example embodiment.

FIG. 4C shows the determination of an operating bias voltage using two threshold bias voltages, in accordance with an example embodiment. The average 422 of the two threshold bias voltages 408, 418 may be computed. The operating bias voltage 424 for the photodiode may then be determined by subtracting a predetermined fixed amount from the average 422 of the threshold voltages. The procedure may be repeated additional times to determine additional threshold voltages before computing the average as well.

Other methods of combining multiple threshold bias voltages are also possible. For example, in some applications, it may be appropriate to assign a lower weight to earlier-in-time threshold bias voltages. Atmospheric conditions may change over time, making earlier results less accurate. Accordingly, in an example embodiment, a decreasing exponential function may be used as a weight function to apply to the determined threshold bias voltages. The operating bias voltage of the photodiode may be determined by assigning higher weight to more recently determined threshold bias voltages and lower weight to earlier-in-time threshold bias voltages.

Figure 5:
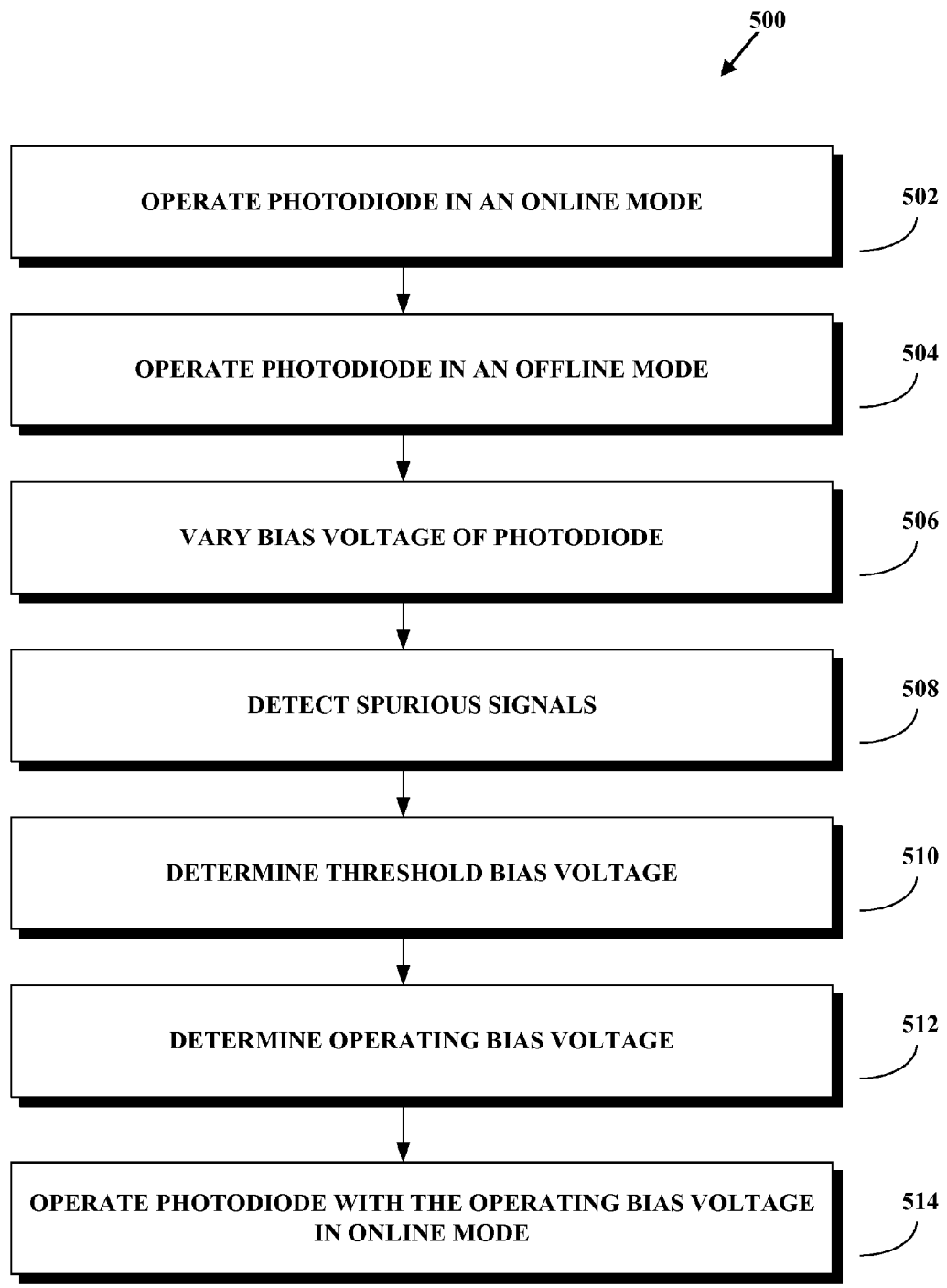
FIG. 5 is a flowchart depicting a method for dynamically determining the operating bias voltage of a photodiode, in accordance with an example embodiment.

An additional example method may involve switching a photodiode to an offline mode, varying the bias voltage of the photodiode and detecting spurious signals to determine an operating bias voltage for the photodiode, and then switching the photodiode back to an online mode. FIG. 5 shows a flowchart depicting such an example method 500 for switching a photodiode to an offline mode and determining the operating bias voltage of the photodiode, in accordance with an example embodiment. Method 500 shown in FIG. 5 presents an embodiment of a method that could be implemented in a LIDAR device, and may be performed by a computing device or processor of the LIDAR device.

At 502, the method 500 may involve operating a photodiode in an online mode in which the photodiode receives one or more light pulses transmitted by a LIDAR system. While the photodiode is operated in online mode, the LIDAR system may be transmitting light signals and the photodiode may be receiving reflected light signals. For example, the photodiode may be used to detect objects in the surrounding environment or to determine the distance between two objects.

At 504, the method 500 may involve operating the photodiode in an offline mode in which the photodiode does not receive light pulses transmitted by the LIDAR system. The photodiode may be operated in an offline mode, for example, at times when the LIDAR system is not transmitted light pulses. In an example embodiment, the photodiode may be operated in offline mode at fixed intervals. For example, the photodiode may be switched to offline mode once per minute, once per every fifteen minutes, or once per hour. Other intervals may also be appropriate for a given application.

In another example embodiment, step 504 may involve switching the photodiode to offline mode according to one or more environmental factors. By way of example, environmental factors may include temperature, ambient lighting, humidity, or partial physical obstructions. These environmental factors may have a significant effect on the sensitivity of the photodiode. For instance, if the level of ambient lighting drops, the sensitivity of the photodiode may also drop. Accordingly, it may be appropriate to switch the photodiode to offline mode to determine a particular operating bias voltage for the photodiode.

In an additional example embodiment, step 504 may involve switching the photodiode to offline mode according to one or more wavelengths of one or more light signals. A LIDAR system may need to detect multiple different wavelengths of light signals. For a given wavelength of light, the fundamental operating characteristics of the photodiode do not change. However, the preferred operating bias voltage of the photodiode may change. Therefore, it may be appropriate to the take the photodiode offline to determine a particular operating bias voltage based on varying wavelengths of received light signals.

At 506-512, method 500 may involve varying the bias voltage of the photodiode and detecting spurious signals in order to determine an operating bias voltage for the photodiode in a manner similar to steps 202-208 of method 200. Accordingly, all of the information disclosed and all of the example embodiments discussed with regard to steps 202-208 of method 200 also apply to steps 506-512 of method 500.

At 514, the method 500 may involve operating the photodiode with the operating bias voltage in a subsequent online mode in which the photodiode receives one or more light pulses transmitted by the LIDAR system. After an operating bias voltage for the photodiode is determined in steps 506-512, the operating bias voltage of the photodiode may be set to the determined bias voltage. Then, the photodiode may be placed back in online mode to receive light pulses transmitted by the LIDAR system.

Figure 6:
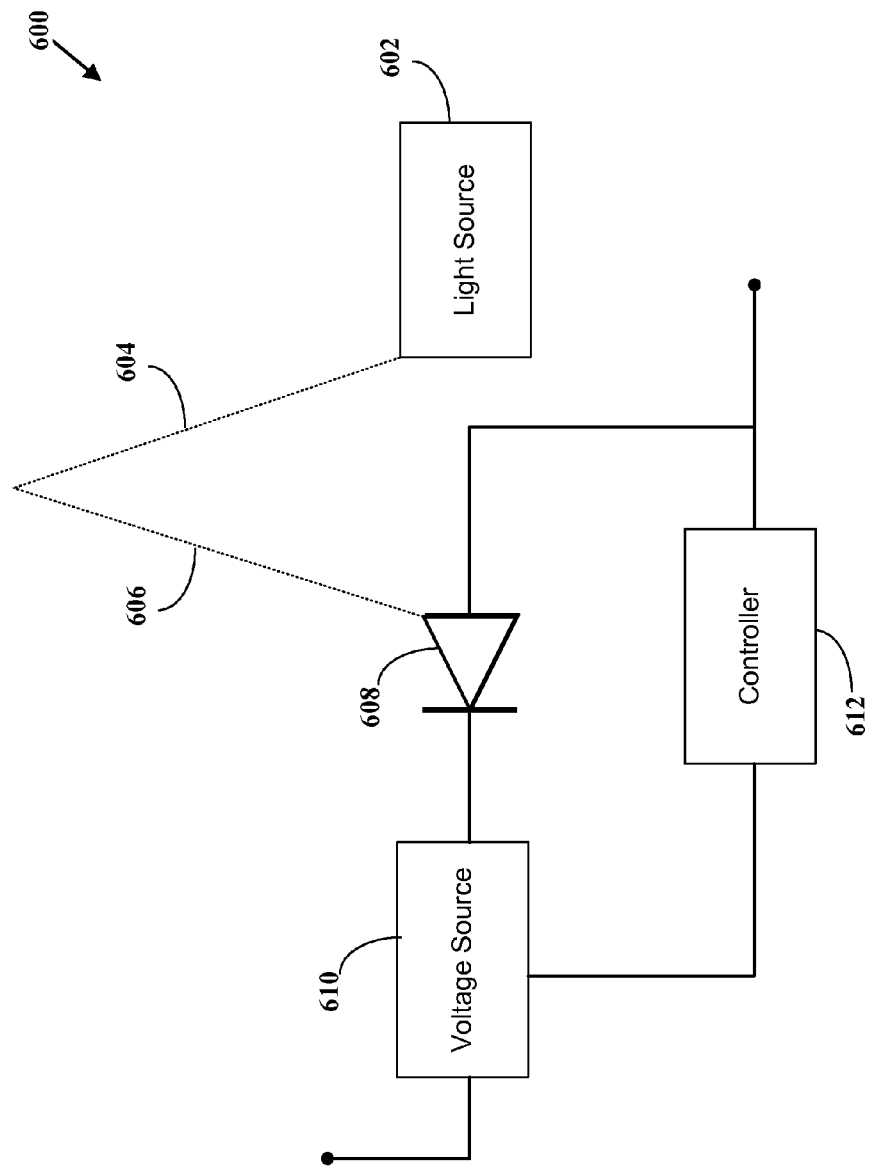
FIG. 6 is a simplified block diagram of a LIDAR device, in accordance with an example embodiment.

FIG. 6 depicts a simplified block diagram of a LIDAR device 600, in accordance with an example embodiment. The LIDAR device 600 may include a light source 602, a photodiode 608, a voltage source 610, and a controller 612, among other components. Although the various elements of the LIDAR device 600 may be described herein as separate elements, it should be understood that the elements could just as well be physically integrated together or distributed in any suitable manner.

The light source 602 may be any suitable device/component capable of emitting a laser light beam 604. The light source 602 may be configured to emit a continuous laser light beam or laser pulses. The light source 602 may be a gas laser, a chemical laser, a solid-state laser, or a semiconductor laser diode ("laser diode"), among other possible laser types. The light source 602 may include any suitable number of and/or combination of laser devices. For example, the light source may include multiple laser diodes and/or multiple solid-state lasers. The light source 602 may be configured to emit a light beam at a particular wavelength and/or wavelength range. For example, the light source 602 may include at least one laser diode configured to emit a light signal in a defined wavelength range.

The photodiode 608 may be a device capable of receive a reflected light signal 606. The photodiode 608 may be configured to detect particular wavelengths/frequencies of light, e.g., ultraviolet, visible, and/or infrared. The photodiode 608 may be configured to detect light beams at a particular wavelength and/or wavelength range, as used by the light source 602. The photodiode 608 may be configured to convert light into either current or voltage. In an example embodiment, the photodiode 608 may be an avalanche photodiode.

The voltage source 610 may be any suitable voltage source that can manage, receive, generate, store, and/or distribute necessary voltage for the operation of the photodiode 608. For example, the voltage source 610 may be a battery capable of providing a bias voltage to the photodiode 608. In an example embodiment, the voltage source 610 may be capable of providing a bias voltage within the range of 150 volts and 220 volts. However, other ranges of voltages may also be used.

The controller 612 may be a computing device configured to perform the functions described above in connection to method 200 of FIG. 2 or method 500 of FIG. 5. In particular, the controller 612 may control the power source 610 to apply a bias voltage to the photodiode 608 and vary the bias voltage. In one embodiment, the controller 612 may apply bias voltages in increasing order. However, the controller 612 may also be designed to sometimes decrease the applied bias voltage. In another embodiment, the controller 612 may increase the applied bias voltages substantially linearly.

The controller 612 may detect spurious signals generated by the photodiode 608 while varying the bias voltage. For example, the controller 612 may detect a spurious signal by determining when the photodiode 608 generates a measurable current when a light signal 604 has not been sent by the light source 602. At each of one or more bias voltage levels, the controller 612 may determine a frequency of spurious signals generated by the photodiode 608.

The controller 612 may determine a threshold bias voltage for the photodiode 608 at which a frequency of spurious signals reaches a predetermined threshold frequency. If the frequency of spurious signals is lower than a threshold frequency, the controller 612 may increase the applied bias voltage. The controller 612 may determine a threshold bias voltage by finding a bias voltage that causes a frequency of spurious signals equal to or close to the threshold frequency.

The controller 612 may determine an operating bias voltage for the photodiode 608. The controller 612 may set the operating bias voltage to a voltage less than the threshold bias voltage. In an example embodiment, the controller 612 may set the operating bias voltage of the photodiode 608 to the threshold bias voltage minus a predetermined fixed amount. For example, the controller 612 may set the operating bias voltage to the threshold bias voltage minus 2V, or the threshold bias voltage minus 3V.

The controller 612 may control the voltage source 610 to apply the operating bias voltage to the photodiode 608. After the controller 612 determines an operating bias voltage for the photodiode 608, the controller 612 may control the voltage source 610 to apply the determined operating bias voltage to the photodiode 608. The photodiode 608 may then receive reflected light signals transmitted by the light source 602.

In an additional embodiment, the controller 612 may be configured to detect spurious signals generated by the photodiode 608 while varying the bias voltage during an offline mode in which the photodiode 608 does not receive reflected light pulses transmitted by the light source 602. In an example embodiment, the controller 612 may switch the photodiode 608 to an offline mode at times when the light source 602 is not transmitting light signals. In an example embodiment, the controller 612 may be designed to switch the photodiode 608 to an offline mode at fixed intervals. For example, the controller 612 may switch the photodiode 608 to an offline mode once per minute, once per every fifteen minutes, or once per hour. Other intervals may also be appropriate for a given application.

In another example embodiment, the controller 612 may switch the photodiode 608 to an offline mode according to one or more environmental factors. For example, the controller 612 may receive information about temperature, ambient lighting, humidity, or partial physical obstructions from one or more input devices. These environmental factors may have a significant effect on the sensitivity of the photodiode. In an example embodiment, the controller 612 may switch the photodiode 608 to an offline mode according to these additional inputs in order to determine a particular operating bias voltage for the photodiode 608.

Figure 7:
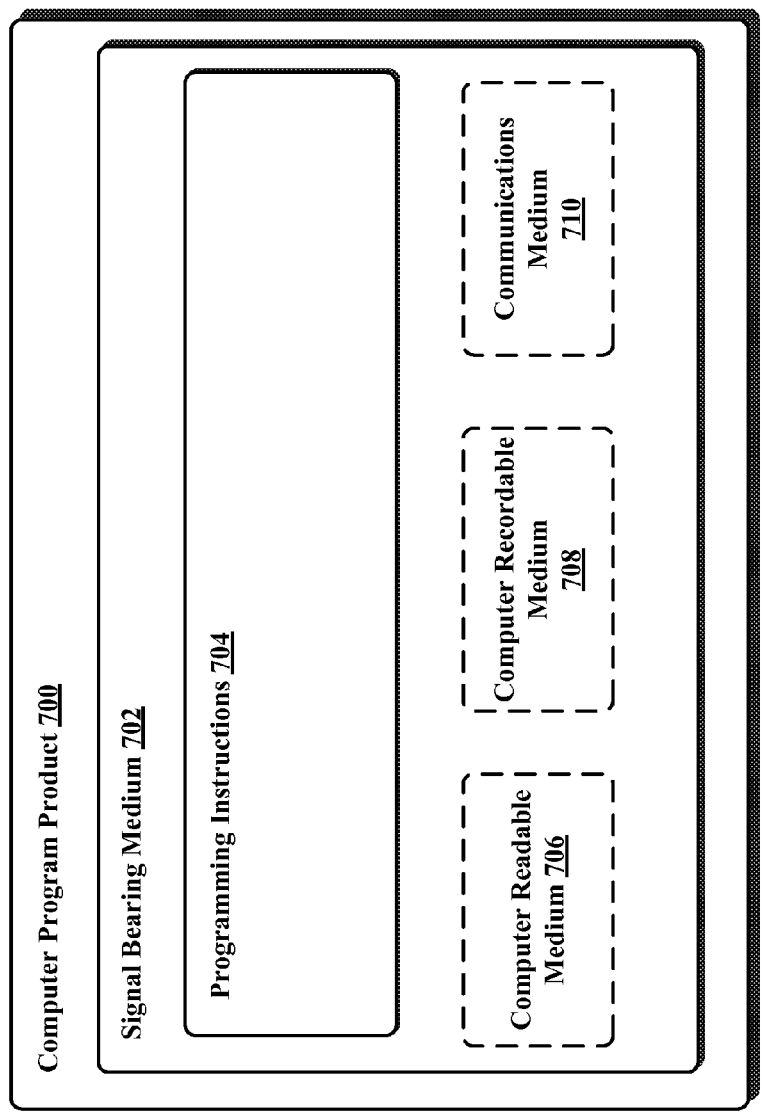
FIG. 7 is a simplified block diagram of an example computer-readable medium, in accordance with an example embodiment.

As indicated above in some embodiments, the disclosed methods may be implemented by computer program instructions encoded on a non-transitory computer-readable storage media in a machine-readable format, or on other non-transitory media or articles of manufacture. FIG. 7 is a schematic illustrating a conceptual partial view of an example computer program product that includes a computer program for executing a computer process on a computing device, arranged according to at least some embodiments presented herein.

In one embodiment, an example computer program product 700 is provided using a signal bearing medium 702. Signal bearing medium 702 may include one or more programming instructions 704 that, when executed by one or more processors may provide functionality or portions of the functionality described with respect to FIGS. 2 and 5.

In some examples, signal bearing medium 702 may encompass a non-transitory computer-readable medium 706, such as, but not limited to, a hard disk drive, a Compact Disc (CD), a Digital Video Disk (DVD), a digital tape, memory, etc. In some implementations, signal bearing medium 702 may encompass a computer recordable medium 708, such as, but not limited to, memory, read/write (R/W) CDs, R/W DVDs, etc. In other implementations, signal bearing medium 702 may encompass a communications medium 710, such as, but not limited to, a digital and/or an analog communication medium (e.g., a fiber optic cable, a waveguide, a wired communications link, a wireless communication link, etc.). Thus, for example, signal bearing medium 702 may be conveyed by a wireless form of communications medium 710.

One or more programming instructions 704 may be, for example, computer executable and/or logic implemented instructions. In some examples, a processing unit such as one that may be part of the LIDAR device in FIG. 6 may be configured to provide various operations, functions, or actions in response to programming instructions 704 conveyed to the computing device by one or more of computer readable medium 706, computer recordable medium 708, and/or communications medium 710.

The non-transitory computer readable medium could also be distributed among multiple data storage elements, which could be remotely located from each other. The computing device that executes some or all of the stored instructions could be a computing device that includes at least one processor. Further, the computing device may be one of multiple computing devices that execute some or all of the stored instructions.

While various example aspects and example embodiments have been disclosed herein, other aspects and embodiments will be apparent to those skilled in the art. The various example aspects and example embodiments disclosed herein are for purposes of illustration and are not intended to be limiting, with the true scope and spirit being indicated by the following claims.

We claim:

1. A method comprising:
varying a bias voltage of a photodiode;
detecting spurious signals generated by the photodiode while varying the bias voltage of the photodiode;
determining, for each of one or more bias voltages, a respective frequency of occurrence of the spurious signals;
determining a threshold bias voltage at which a frequency of occurrence of the spurious signals reaches a threshold frequency;
determining an operating bias voltage for the photodiode based on at least the threshold bias voltage; and
operating the photodiode with the operating bias voltage in a light-detection and ranging (LIDAR) system.

2. The method of claim 1, wherein the photodiode comprises an avalanche photodiode.

3. The method of claim 1, wherein varying the bias voltage of the photodiode comprises increasing the bias voltage of the photodiode.

4. The method of claim 3, wherein increasing the bias voltage of the photodiode comprises increasing the bias voltage substantially linearly.

5. The method of claim 1, wherein varying the bias voltage of the photodiode comprises applying at least one bias voltage between 150 volts and 220 volts.

6. The method of claim 1, wherein determining the operating bias voltage for the photodiode based on at least the threshold bias voltage comprises setting the operating bias voltage to be a predetermined amount less than the threshold bias voltage.

7. The method of claim 6, wherein the predetermined amount is between 2 volts and 3 volts.

8. The method of claim 1, further comprising:
    determining one or more additional threshold bias voltages by a process comprising detecting additional spurious signals generated by the photodiode while additionally varying the bias voltage of the photodiode; and
    wherein determining the operating bias voltage for the photodiode based on at least the threshold bias voltage comprises determining the operating bias voltage based on at least the threshold bias voltage and the one or more additional threshold bias voltages.

9. The method of claim 8, wherein determining the operating bias voltage based on at least the threshold bias voltage and the one or more additional threshold bias voltages comprises determining the operating bias voltage based on an average of the threshold bias voltage and the one or more additional threshold bias voltages.

10. The method of claim 8, wherein determining the operating bias voltage based on at least the threshold bias voltage and the one or more additional threshold bias voltages comprises determining the operating bias voltage based on a weighted average of the threshold bias voltage and the one or more additional threshold bias voltages.

11. A method comprising:
    operating a photodiode in an online mode in which the photodiode receives one or more light pulses transmitted by a light-detection and ranging (LIDAR) system;
    after operating the photodiode in the online mode, operating the photodiode in an offline mode in which the photodiode does not receive light pulses transmitted by the LIDAR system, wherein operating the photodiode in the offline mode comprises:
        varying a bias voltage of the photodiode;
        detecting spurious signals generated while varying the bias voltage of the photodiode;
        determining, for each of one or more bias voltages, a respective frequency of occurrence of the spurious signals;
        determining a threshold bias voltage at which a frequency of occurrence of the spurious signals reaches a threshold frequency; and
        determining an operating bias voltage for the photodiode based on at least the threshold bias voltage; and
    after operating the photodiode in the offline mode, operating the photodiode in a subsequent online mode in which the photodiode receives one or more light pulses transmitted by the LIDAR system, wherein operating the photodiode in the subsequent online mode comprises operating the photodiode with the operating bias voltage.

12. The method of claim 11, further comprising operating the photodiode in additional offline modes to determine additional operating bias voltages and operating the photodiode in additional online modes with the additional operating bias voltages.

13. The method of claim 12, further comprising scheduling the additional offline modes based on one or more environmental factors.

14. The method of claim 12, further comprising scheduling the additional offline modes to occur at fixed time intervals.

15. A light-detection and ranging (LIDAR) device, comprising:
    a light source, wherein the light source is configured to emit light pulses;
    a photodiode, wherein the photodiode is configured to receive light pulses that have been transmitted by the light source and reflected by one or more objects in an environment of the LIDAR device;
    a voltage source configured to apply a bias voltage to the photodiode;
    and a controller configured to:
        control the power source to vary the bias voltage applied to the photodiode;
        detect spurious signals generated by the photodiode while varying the bias voltage;
        determine, for each of one or more bias voltages, a respective frequency of occurrence of the spurious signals;
        determine a threshold bias voltage at which a frequency of occurrence of the spurious signals reaches a threshold frequency;
        determine an operating bias voltage based on at least the threshold bias voltage; and
        control the voltage source to apply the operating bias voltage to the photodiode.

16. The LIDAR device of claim 15, wherein the photodiode comprises an avalanche photodiode.

17. The LIDAR device of claim 15, wherein the controller is configured to detect spurious signals generated by the photodiode while varying the bias voltage during each of a plurality of offline modes in which the photodiode does not receive light pulses transmitted by the light source.

18. The LIDAR device of claim 15, wherein the controller is configured to schedule the offline modes to occur at fixed intervals.

19. The LIDAR device of claim 15, wherein the controller is configured to schedule the offline modes based on one or more environmental factors.

20. The LIDAR device of claim 15, wherein the controller is configured to set the operating bias voltage to be less than the threshold bias voltage by a predetermined amount.

* * * * *